United States Patent [19]

Rapp

[11] Patent Number: 4,543,713

[45] Date of Patent: Oct. 1, 1985

[54] TECHNIQUE FOR INSERTING CONNECTOR LEADS INTO A CIRCUIT BOARD

[75] Inventor: Willard E. Rapp, Franklin Township, Somerset County, N.J.

[73] Assignee: AT&T Technologies, Inc., New York, N.Y.

[21] Appl. No.: 521,514

[22] Filed: Aug. 8, 1983

[51] Int. Cl.[4] .......................... H05K 3/30; B23P 19/00
[52] U.S. Cl. .......................................... 29/837; 29/741
[58] Field of Search .................... 29/741, 837, 739; 174/52 FP

[56] References Cited

U.S. PATENT DOCUMENTS

| | | |
|---|---|---|
| 3,442,430 | 5/1969 | Ackerman et al. |
| 3,550,238 | 12/1970 | Allen et al. ............ 29/741 X |
| 3,564,691 | 2/1971 | Ackerman ............. 29/741 X |
| 3,688,393 | 9/1972 | Halstead |
| 3,846,907 | 11/1974 | Ivanovic ............... 174/52 FP X |
| 4,161,064 | 7/1979 | Woodman, Jr. et al. |
| 4,286,380 | 9/1981 | Blount ..................... 29/741 |
| 4,293,998 | 10/1981 | Kawa et al. |
| 4,328,613 | 5/1982 | Kirkpatrick |

OTHER PUBLICATIONS

Western Elec Tech Dig. No. 70, Apr. 1983, pp. 11–12, Article by W. C. Kent.

Primary Examiner—Howard N. Goldberg
Assistant Examiner—Carl J. Arbes
Attorney, Agent, or Firm—D. J. Kirk

[57] ABSTRACT

A plurality of rows of leads (6,7) extending from a connector (5) are inserted into vias (32—32) in a circuit board (24) having components thereon. A plurality of slots (84—84) in a comb (60) are aligned with the vias (32—32) and the connector (5) moved towards the comb to position the leads (6,7) therein. A downward force is applied to the connector (5) causing the leads (6,7) to slide along the slots (84—84) and into the vias (32—32). The comb (60) is arcuately moved a short distance to disengage the leads (6,7) therefrom and then moved upward, away from the board (24). The board (24) with the connector (5) thereon is removed. The comb (60) is then moved back to the vertical position to receive the leads of the next connector (5) to be inserted in the vias (32—32).

8 Claims, 11 Drawing Figures

TECHNIQUE FOR INSERTING CONNECTOR LEADS INTO A CIRCUIT BOARD

TECHNICAL FIELD

The instant invention relates to a method and apparatus for mounting a connector on a circuit board. In particular, a plurality of leads extending from the connector are inserted into vias in a circuit board.

BACKGROUND OF THE INVENTION

In order to align a plurality of rows of leads with corresponding rows of vias in a circuit board it is well known to use a multi-tiered comb. Such a comb has a plurality of rows of vertical slots therein having different depths which correspond to the different rows to be inserted into the vias. U.S. Pat. No. 4,328,613 to Kirkpatrick which issued on May 11, 1982 and is assigned to Bell Telephone Laboratories depicts such a comb which is moved along the surface of a circuit board having no components thereon. The comb moves towards a connector which is held in fixed, spaced relation to the surface of the board with two rows of leads extending therefrom in rough alignment with two rows of vias in the board. The moving comb captures the leads in the vertical slots and stops when the leads are accurately aligned to the vias. A downward force is then applied to the connector to insert the leads into the vias. The comb is then pulled away from the leads along the surface of the board.

Such a technique has been found to be most effective for inserting connector leads into vias. However, it cannot be used when components have previously been mounted on the wiring board as the components preclude movement of a comb along the surface thereof. One technique which permits insertion of the connector leads into the vias of a circuit board having components thereon makes use of a comb which is pivotably mounted adjacent a lateral edge of the board. The connector is positioned above the circuit board substantially as shown in the above-referred to patent. The comb is pivoted in a plane normal to the surface of the board to contact the surface between the connector leads and the components on the board. The comb is then urged towards the leads for alignment and subsequent insertion. Once insertion has taken place, the comb is then moved back, along the board, and then pivoted away from the board. Such a technique is also effective but requires substantial forward and backward movement along the board which takes up space in which components can be attached to the board.

Accordingly, there is a need for a connector insertion technique which minimized the distance between the vias and the components required for movement of the comb.

SUMMARY OF THE INVENTION

The instant invention overcomes the foregoing problem with a method of mounting a connector, having a plurality of leads extending therefrom, onto a circuit board having a plurality of vias therethrough. The method comprises the steps of: placing the circuit board on a support member; positioning a comb, having individual slots therein corresponding to the spatial orientation of the individual vias, to a position spaced from the circuit board with the slots aligned with the respective vias; urging the connector towards the comb to engage the leads in the respective slots therein; moving the comb and connector in concert towards the board until the comb contacts the board; applying a force to the connector to urge the leads along the slots into the respective vias; arcuately moving the comb to disengage the leads therefrom; and moving the comb away from the circuit board to permit removal of the board, with the connector mounted thereon, from the support member.

Advantageously, the instant technique uses a minimum of circuit board space for the connector insertion process which permits additional components to be placed on the board.

DETAILED DESCRIPTION

Figure 1:
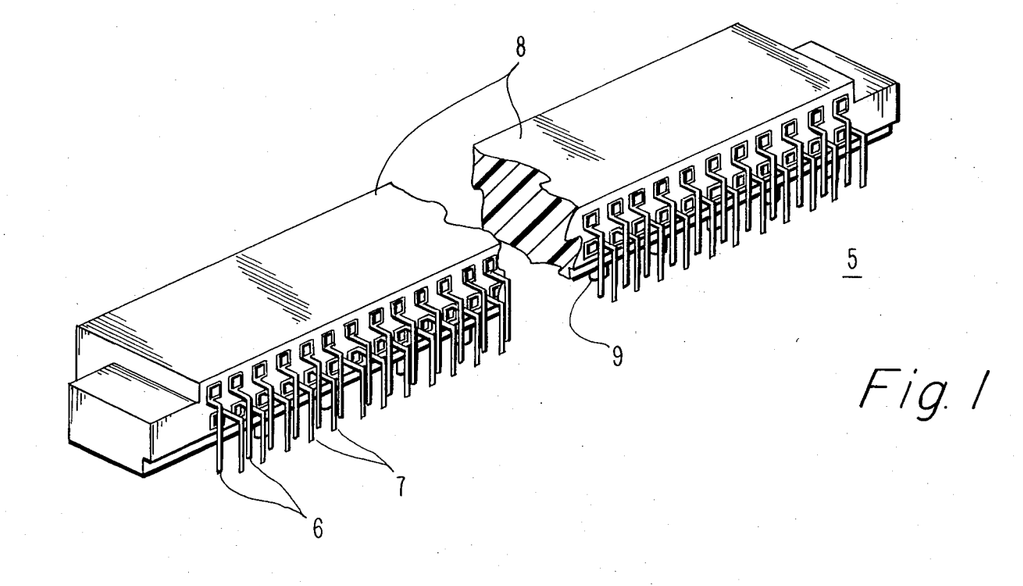
FIG. 1 is an isometric view of a connector.

FIG. 1 is an isometric view of a connector 5 having first and second rows of electrically conductive leads 6 and 7, respectively, extending from an insulative housing 8. A plurality of nonconductive heat stakeable studs 9—9 are located on the underside thereof.

Figure 2:
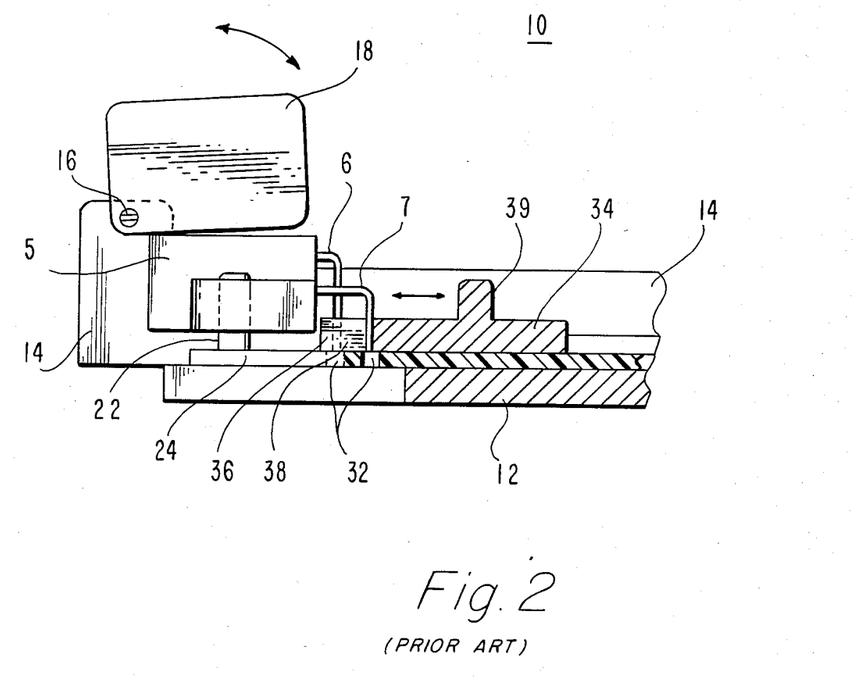
FIGS. 2 and 3 are a side elevation and plan view, respectively, of a prior art contact insertion apparatus.
Figure 3:
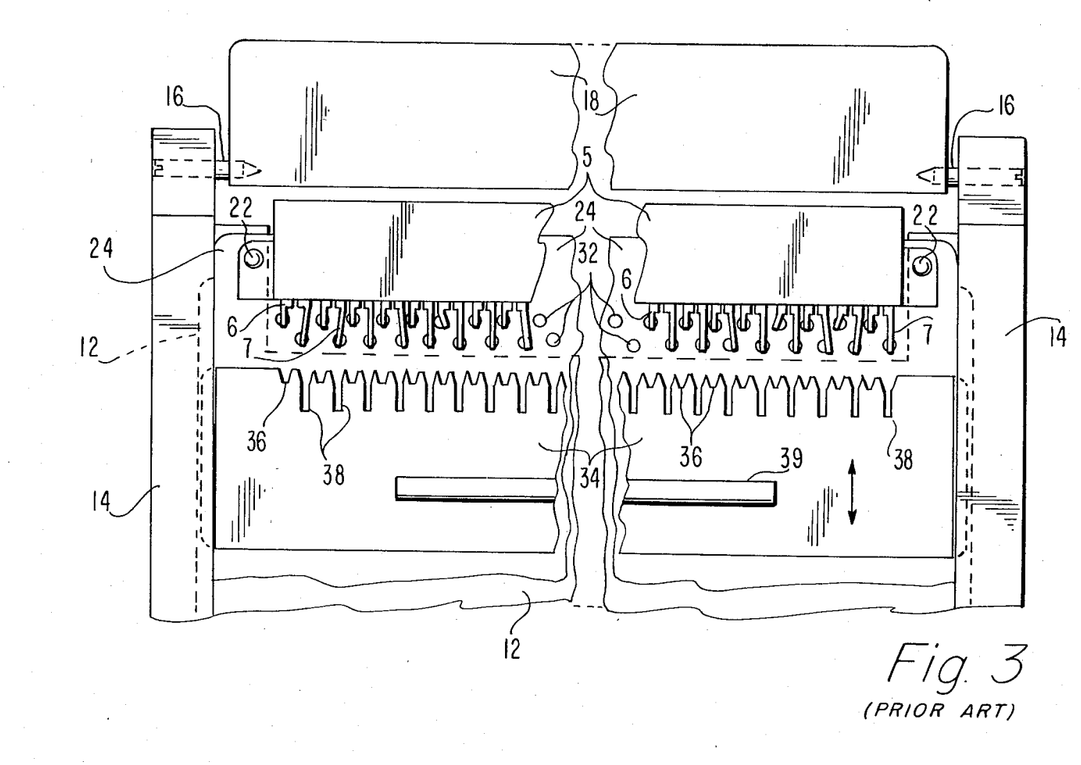

FIGS. 2 and 3 depict the prior art connector lead insertion apparatus 10 described in the aforementioned Kirkpatrick patent. The apparatus 10 is comprised of a base 12 having lateral support members 14—14 mounted thereon. The lateral support members 14—14 have pins 16—16 projecting therefrom into a rotatable pressure plate 18. A pair of registration pins 22—22 project upward from the base 12. The connector 5 shown in FIG. 2 does not have studs 9—9 depending therefrom as depicted in FIG. 1.

In operation (see FIG. 2) a circuit board 24 is placed on the base 12. A connector 5, with the first and second rows of leads 6 and 7 extending therefrom, is positioned and held in place, by the alignment pins 22—22. The connector 5 is located over the end of the board 24 with the leads in rough alignment with a plurality of via holes 32—32 therein. A comb 34, having first and second tiers of lead receiving slots 36 and 38, respectively, is urged towards the rows of leads 6 and 7, along the surface of the board 24 using a handle 39, to capture the leads in the respective slots to align said leads with the vias 32—32. The pressure plate 18 is then rotated about pins 16—16 to contact the connector 5 to urge the rows of leads 6 and 7 into the vias 32—32. The pressure block 18 is then moved counterclockwise, the comb 34 withdrawn and the wiring board 24 with the connector 5 thereon removed. The comb 34 is shown (in FIG. 2) moving along the surface of the circuit board 24 which precludes mounting components thereon.

Figure 4:
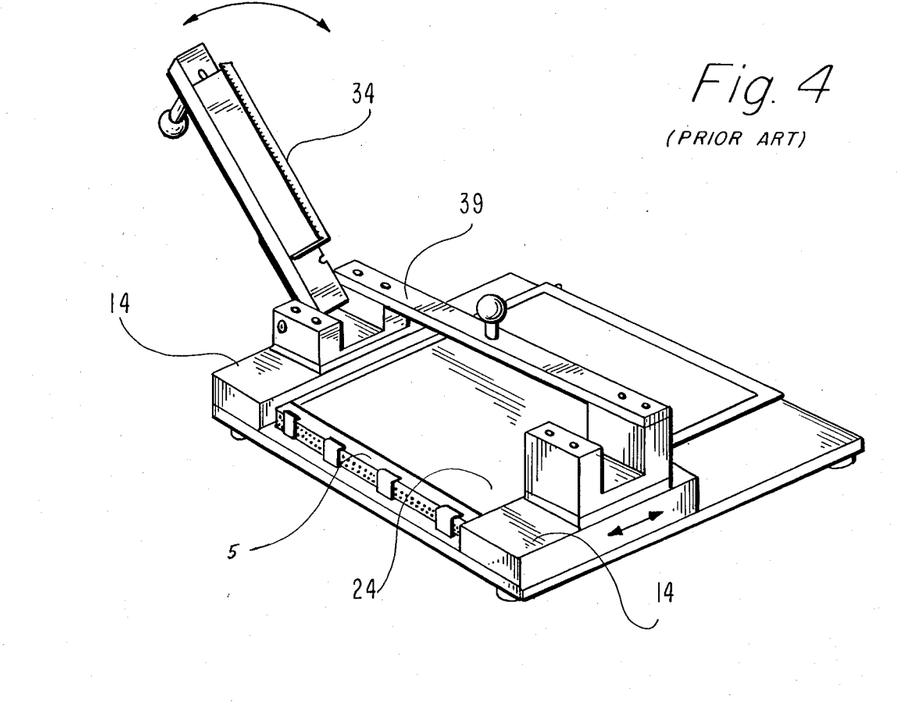
FIG. 4 is an isometric view of an additional prior art insertion apparatus.

Alternatively, the comb 34 may be hingeably mounted on one of the lateral support members 14 and rotated from the position as shown in FIG. 4 to a position proximate the board. The comb 34 is then pushed towards the connector 5 to align the leads 6 and 7 with the openings 32—32 and the connector 5 pushed downward into the openings.

In the first prior art embodiment (FIG. 2) no components can be on the board 24 during the lead insertion operation. While in the second embodiment (FIG. 4) the comb 34 must be initially pivoted to be in contact with the surface of the board 24 and moved forward to capture the leads 6 and 7 therein. The comb 34 then must be withdrawn along the surface of the board 24 and pivoted away from the circuit board 24. The comb 34 must be disengaged (e.g., withdrawn along the surface of the board 24) prior to the raising or lifting thereof to avoid deforming or pulling the leads from the vias 32—32 due to frictional contact therewith. Although the second embodiment permits components to be mounted on the board 24 they must be at a distance sufficient to allow for the back-and-forth movement of the comb 34 along the surface of the board. Providing such additional distance undesirably decreases the amount of space available for components on the board 24.

Figure 5:
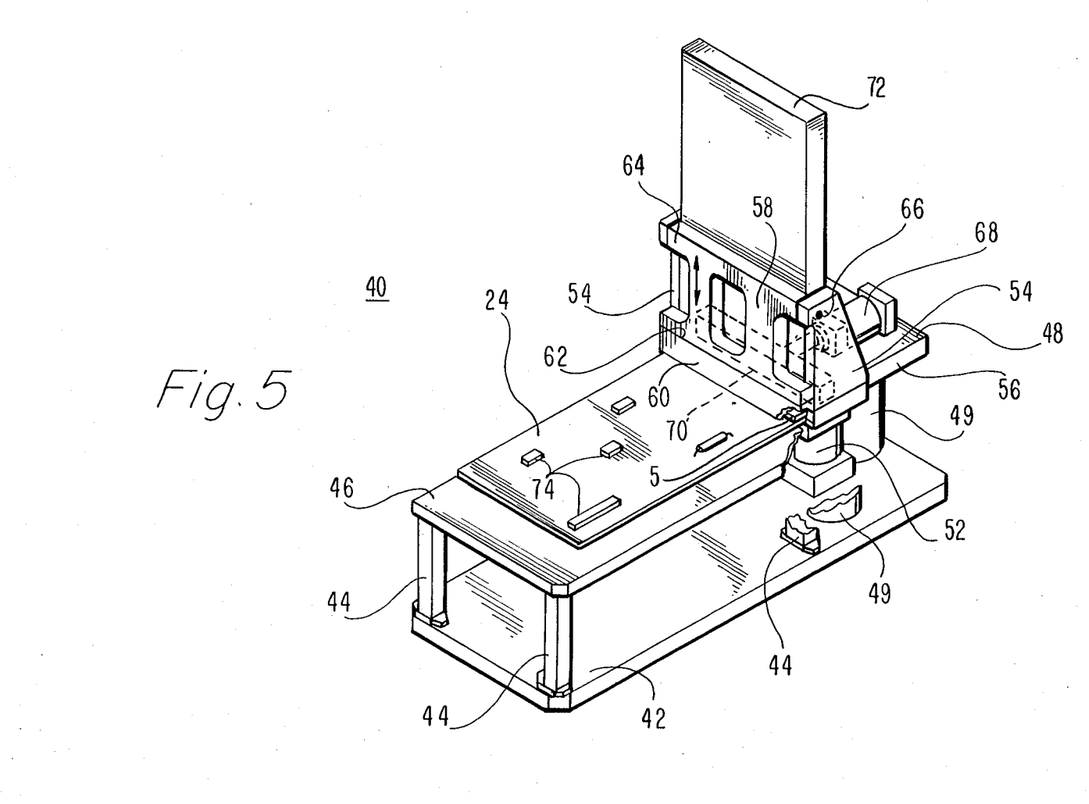
FIGS. 5 and 6 are a partial isometric views of the instant insertion apparatus.
Figure 6:
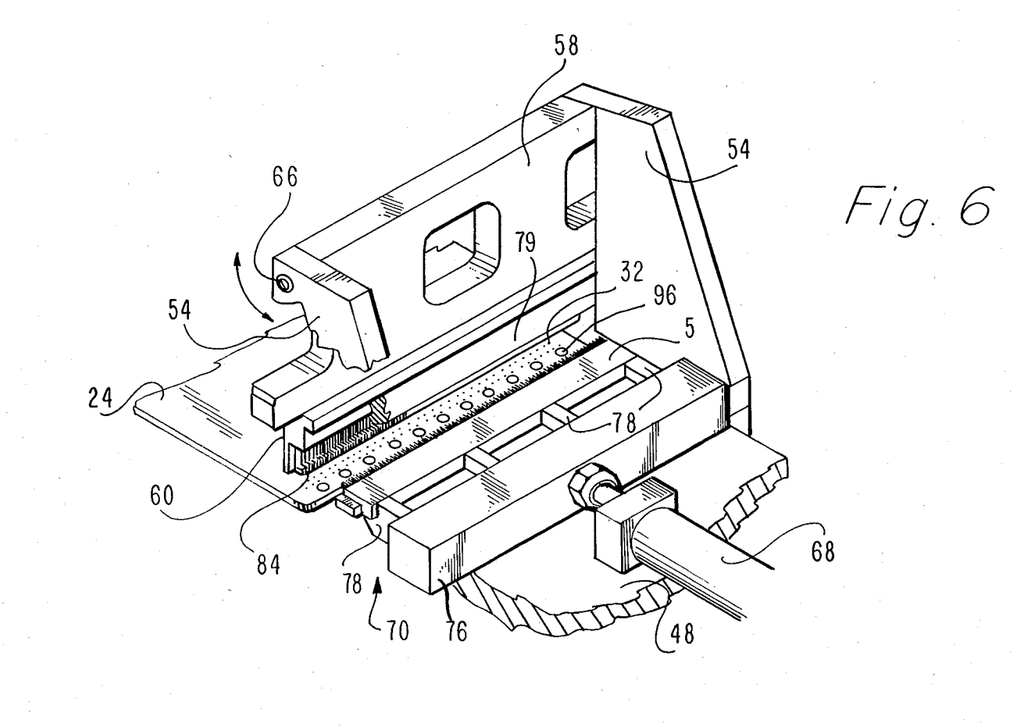

The instant apparatus depicted in FIGS. 5 and 6 overcomes the foregoing problem. FIG. 5 is a partial isometric view of the instant connector insertion apparatus generally designated by the numeral 40. The apparatus 40 is comprised of a baseplate 42 having a first plurality of pillars 44—44 which support a circuit board holder 46. A platform 48, supported by a second plurality of pillars 49—49, is mounted for vertical movement on a first pneumatic cylinder 52. Side members 54—54 are fixedly mounted to and extend vertically upward from the sides 56—56 of the platform 48. A comb support 58 has a comb 60 fixedly mounted at the bottom portion 62 thereof and is rotatably attached at its upper portion 64 to the side members 54—54 by pins 66—66. A second pneumatic cylinder 68 is fixedly mounted on the platform 48 to control the horizontal movement of a connector pusher assembly 70 (see FIG. 6). A magazine 72 containing a plurality of connectors 5 (not shown) is mounted normal to the platform 48. A circuit board 24 having components 74—74 and a connector 5 thereon is shown positioned on the holder 46.

Figure 7:
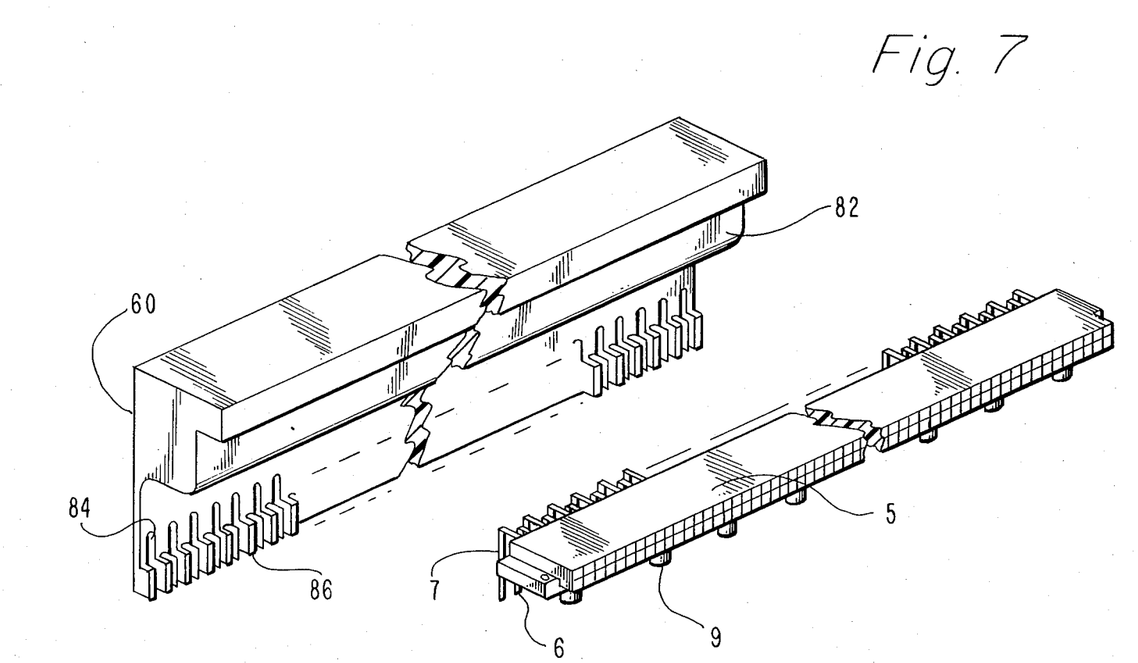
FIGS. 7, 8 and 9 are isometric, side and bottom views, respectively, of a lead comb used in the instant apparatus.
Figures 8, 9:
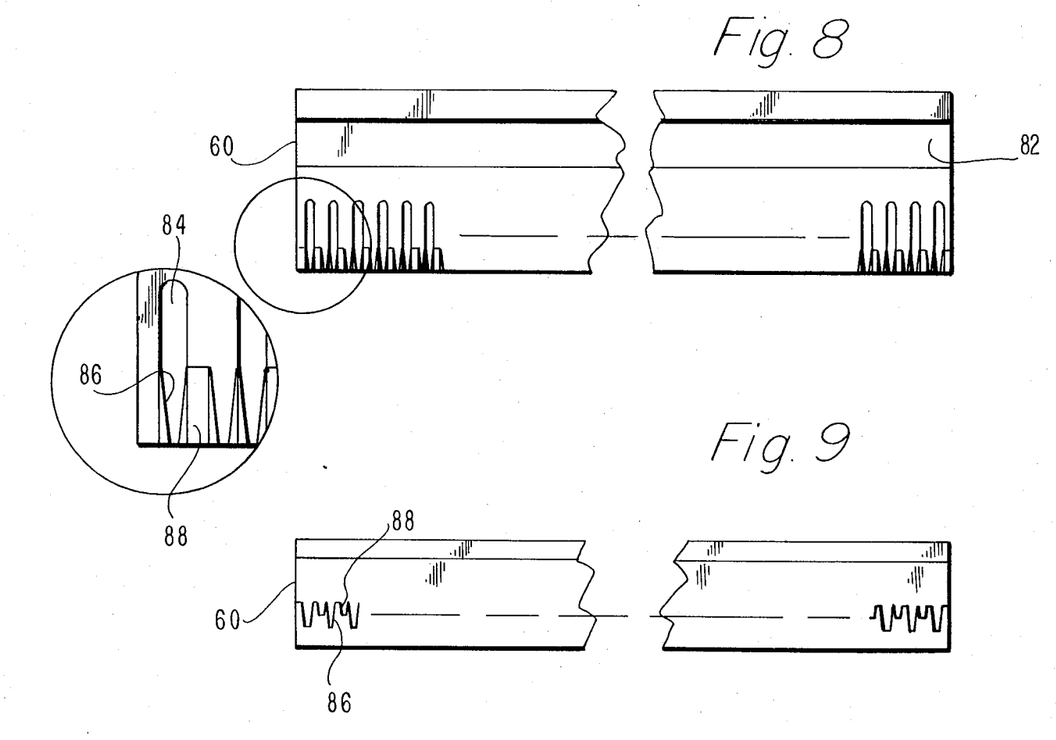

FIG. 6 is a partial isometric view of the instant apparatus showing details of the pusher assembly 70 and the comb 60. The assembly 70 is comprised of block 76 with a plurality of horizontally extending arms 78—78 which loosely hold a connector 5. A cross-bar member 79 is fixedly connected at each end to the side members 54—54. The comb 60 which can be seen in further detail in FIGS. 7, 8 and 9 has a body portion 82 with a plurality of relatively wide, elongated slots 84—84 having a tapered bottom portion 86. Additionally, there is a plurality of relatively short, shallow, slots 88—88 therein (see side view in FIG. 8 and bottom view in FIG. 9) located between the slots 84—84.

Figure 10:
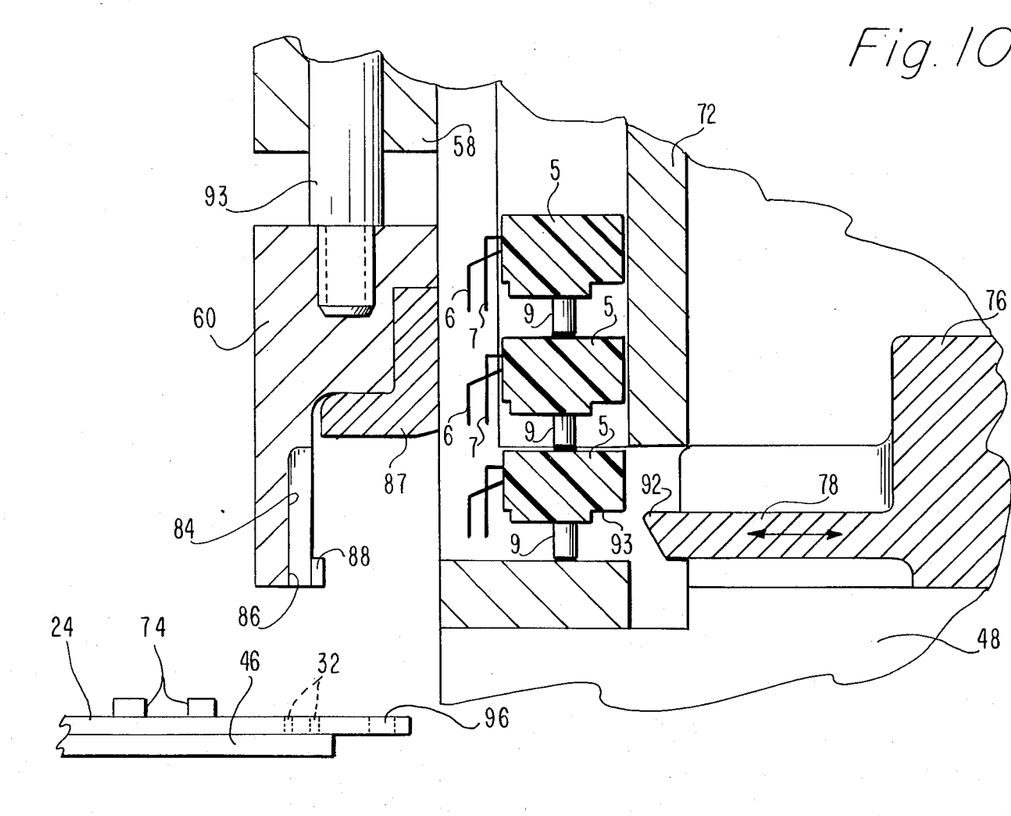
FIGS. 10 and 11 are cross-sectional views depicting the operation of the instant apparatus.
Figure 11:
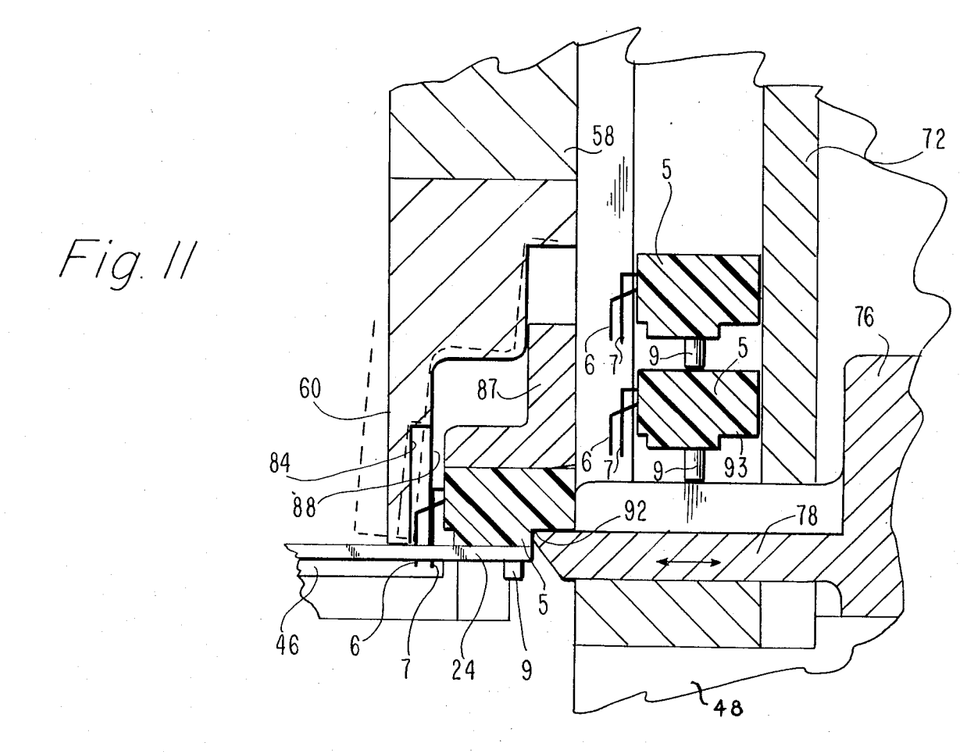

The connector 5 mounting operation can best be seen in FIGS. 10 and 11 which are partial cross-sectional views in a vertical plane through the instant apparatus 40. As shown in FIG. 10 a circuit board 24 is placed on the holder 46 and the magazine 72 positioned proximate the arms 78 of the pusher 76. The platform 48 is at the maximum upward position under the control of the first pneumatic cylinder 52 (FIG. 5). The pusher 76 has been moved to the right under the control of the second pneumatic cylinder 68 (see FIG. 6) until the ends 92—92 of the arms 78—78 are aligned with a lip 93 of a connector 5. The arms 78—78 are then moved to the left to seat the ends 92—92 in the lip 93 to urge the connector 5 horizontally toward the comb 60. The comb 60 simultaneously moves arcuately in a counterclockwise direction from a nonvertical position (see dashed lines in FIG. 11) to the vertical position as shown in FIG. 10, to vertically align the slots 84 and 88 with the vias 32—32 in the circuit board 24 therebelow.

Continued movement of the connector 5 towards the comb 60 will cause the outer row of terminals 6 to be seated in the upper portion of the elongated slots 84—84. Advantageously, the width of the slots 84—84 (see FIG. 8) is substantially greater than the width of each terminal in the outer row of terminals 6 which are more prone to being bent or deformed than the inner row of terminals 7. Once the outer row of terminals 6 are urged through the tapered portion 86—86 they will readily deform to the vertical position for ready insertion into the openings 32. Additionally, the rows of terminals 6 and 7 when fabricated are bent slightly outward, away from housing 8 (see FIG. 1), to ensure that the terminals will all contact the comb 60.

When the terminals 6 and 7 are seated in the slots 84—84 and 88—88, respectively, the platform 48 is moved downward with the comb 60 moving in unison with the comb support 58 as shown in FIG. 11. The downward motion of the comb 60 halts upon contact with the circuit board 24 while both the support 58 and the cross-bar member 87 continue downward along spring biased guide members 93—93 as shown in FIG. 10. The support 58 will halt proximate the comb 60. As the cross bar member 87 continues to move down it will contact the top of the connector 5 urging the rows of contacts 6 and 7 along the slots 84 and 88, respectively, and into the vias 32—32 as shown in FIG. 11. Simultaneously, the studs 9—9 are driven into openings 96—96 in the board 24. The ends of the studs 9—9 will be flared out in a separate operation to stake the connector 5 to the board 24.

Once the rows of leads 6 and 7 have been inserted into the appropriate vias 32—32 the comb support 58 and comb 60 are pivoted clockwise (see dashed line in FIG. 11) about the pins 66—66 shown in FIG. 6 to space the comb 60 slightly (e.g., 0.040 inch) from the leads 6 and 7. Simultaneously, the arms 78—78 are moved to the right to receive the next connector 5 from the magazine 72. Next, the platform 48 is raised back to the position shown in FIG. 10 in order to remove the connectorized circuit board 24 and place the next board in position to be connectorized.

The above technique has been found most effective for minimizing the space required for the movement of the comb 60 into position for the insertion of the rows of contacts 6 and 7. By first aligning the slots of the comb 60 with the vias 32—32 and then bringing the connector 5 to the comb, space is saved. Additionally, arcuately moving the comb 60 slightly away from the leads to remove contact therebetween conserves additional space.

It is to be understood that the embodiments described herein are merely illustrative of the principles of the invention. Various modifications may be made thereto by persons skilled in the art which will embody the principles of the invention and fall within the spirit and scope thereof.

What is claimed is:

1. A method of mounting a connector, having a plurality of parallel rows of leads extending from one side thereof, onto a circuit board having components thereon and a plurality of parallel rows of vias therethrough, the method comprising the steps of:

placing the circuit board on a support member;

positioning a comb, having parallel rows of slots therein corresponding to the spatial orientation of the parallel rows of vias, proximate the components and spaced from the circuit board with the slots aligned with the respective vias;

urging the connector towards the comb, in a direction parallel to the surface of the circuit board, to engage the leads in the respective slots therein;

moving the comb connector in concert towards the circuit board until the comb contacts the board;

applying a force to the connector to urge the leads along the slots into the respective vias;

arcuately moving the comb, through a small angle, towards the components to disengage the leads therefrom; and moving the comb away from the circuit board in a direction normal to permit removal of the board, with the connector mounted thereon, from the support member.

2. The method as set forth in claim 1, wherein:
the leads extending from the connector are arranged in a plurality of parallel rows.

3. The method as set forth in claim 1, wherein:
the circuit board has a plurality of electrical components mounted thereon.

4. The method as set forth in claim 2, characterized by:
engaging one row of leads in slots that are tapered to receive the leads in a wider upper portion; and
guiding said leads through a narrow lower portion towards said vias.

5. An apparatus for mounting a connector, having a plurality of parallel rows of leads extending from one side thereof, onto a circuit board having components thereon and a plurality of vias therethrough, comprising:

a base;

means, mounted on the base, for supporting the circuit board;

a comb, having individual slots therein corresponding to the spatial orientation of the individual vias;

means, mounted on the base, for arcuately moving the comb to and from a position spaced from the circuit board with the slots aligned with the respective vias;

means, mounted on the base, for urging the connector towards the comb to engage the leads in the respective slots therein;

means, mounted on the base, for moving the comb and connector in concert towards the board until the comb contacts the board; and means, associated with the moving means, for applying a force to the connector to urge the leads along the slots into the respective vias.

6. The apparatus as set forth in claim 5, wherein:
the leads are arranged in a plurality of rows and the slots in the comb.

7. The apparatus as set forth in claim 5, wherein:
the comb has a plurality of elongated slots having an upper portion and lower outlet portion; and
the upper portion is substantially wider than the lower outlet portion.

8. The apparatus as set forth in claim 5, wherein:
the circuit board has a plurality of electrical components mounted thereon.

* * * * *